(12) United States Patent
Matsumoto

(10) Patent No.: US 7,327,377 B2
(45) Date of Patent: Feb. 5, 2008

(54) EXPOSURE APPARATUS AND METHOD FOR EXPOSING A PHOTOSENSITIVE MATERIAL WITH A PLURALITY OF EXPOSURE HEADS

(75) Inventor: Kenji Matsumoto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 563 days.

(21) Appl. No.: 10/830,053

(22) Filed: Apr. 23, 2004

(65) Prior Publication Data
US 2004/0214099 A1    Oct. 28, 2004

(30) Foreign Application Priority Data
Apr. 25, 2003   (JP)   ............................ 2003-121625

(51) Int. Cl.
*B41J 2/45* (2006.01)
(52) U.S. Cl. ..................................... 347/238
(58) Field of Classification Search ............... 347/200, 347/233–240, 246–254; 430/314; 355/67
See application file for complete search history.

(56) References Cited
U.S. PATENT DOCUMENTS 5,107,280 A * 4/1992 Ohashi et al. .............. 347/235
5,450,099 A * 9/1995 Stephenson et al. ........ 347/200
5,656,526 A * 8/1997 Inada et al. ................. 430/314
5,825,400 A * 10/1998 Florence ..................... 347/239
6,184,971 B1 * 2/2001 Narita et al. ................. 355/67

FOREIGN PATENT DOCUMENTS

JP    2000-015864 A    1/2000

* cited by examiner

*Primary Examiner*—Hai Pham
(74) *Attorney, Agent, or Firm*—Sughrue Mion, Pllc.

(57) ABSTRACT

In order to obtain a preferable image without "stripe-shaped unevenness", an exposure apparatus comprising first and second exposure heads having light emitting sections emitting light with first and second intensity arranged in main and sub scanning directions such that an exposure area including an overlapped exposure area overlapping an exposure area of the first exposure head is exposed by the second exposure head and a driving control unit by which light emitting sections of the first and second exposure heads are lit at a predetermined timing in the overlapped exposure area such that a difference in the maximum exposure amount between pixels adjoining each other in the main scanning direction is smaller than a difference in the maximum exposure amount between each pixel in the exposure area of the first exposure head and each pixel in the exposure area of the second exposure head, is provided.

16 Claims, 7 Drawing Sheets

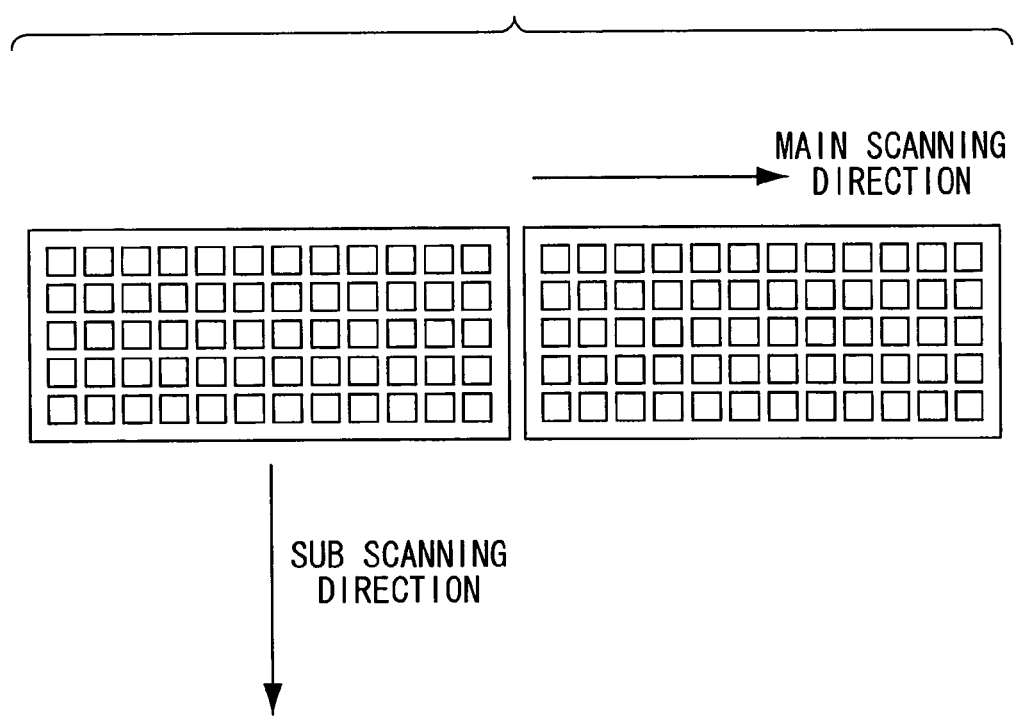

EXPOSURE APPARATUS AND METHOD FOR EXPOSING A PHOTOSENSITIVE MATERIAL WITH A PLURALITY OF EXPOSURE HEADS

CROSS-REFERENCE TO RELATED APPLICATION

This application claims priority under 35 USC 119 from Japanese Patent Application No. 2003-121625, the disclosure of which is incorporated by reference herein.

BACKGROUND OF THE INVENTION

1. Field of the Invention

The present invention relates to exposure apparatuses and an exposure method, and more particularly, to exposure apparatuses and an exposure method, by which a photosensitive material is exposed with a plurality of exposure heads.

2. Description of the Related Art

Recently, there have been various kinds of exposure systems with exposure heads in which light emitting elements are arranged in a one- or two-dimensional manner. In these exposure systems, a wider exposure head is required in order to expose a larger area. However, it is obvious that a larger size of an exposure head requires a remarkable increase in its cost. For example, it may be assumed that the cost is increased not twice, but three to five times when the exposure area is doubled, One method for avoiding a lager size of the exposure head has been considered to expose a larger area with a multihead system in which a plurality of exposure heads are joined in the main scanning direction. However, there has been caused a problem that quality in an image is deteriorated, because simple uniting of the exposure heads causes "stripe-shaped unevenness" in a part corresponding to a joining position of exposed images by a wider pitch between the light emitting elements in the joining part as shown in FIG. 9 or, by a deviation in relative positions between the exposure heads, and then the image with a joint is obtained.

In order to solve such a problem, there has been proposed a multihead writing device (Refer to the Japanese Patent Application Laid-Open No. 2000-15864) in which a plurality of exposure heads are arranged in a staggered manner, and the distance between the light emitting elements in each end part of exposure heads adjacent to each other is made approximately equal to the pitch for the other light emitting elements.

However, "stripe-shaped unevenness" is caused by unevenness in the light-emitting intensity among the exposure heads even if a plurality of the exposure heads are arranged with high accuracy in position adjustment, and then an exposed image with a joint is obtained. Moreover, it is difficult to remove the unevenness in the light-emitting intensity among the exposure heads. For example, even if the light-emitting intensity of the exposure heads is made equal between them at manufacturing the exposure apparatuses, long use of the heads causes the unevenness in the light-emitting intensity among the heads. Moreover, since the light emitting intensity is changed by an environmental temperature at which the exposure apparatuses is used, the unevenness in the light emitting intensity among the exposure heads is caused.

SUMMARY OF THE INVENTION

The present invention has been made in order to solve the above problems, and its object is to obtain a preferable image without "stripe-shaped unevenness" in an exposure apparatuses and an exposure method, by which a photosensitive material is exposed with a plurality of exposure heads.

First Exposure Apparatus

In order to achieve the above-described object, a first exposure apparatuses according to the invention comprises: a first exposure head in which a plurality of light emitting sections which emit light with first intensity are arranged in a main scanning direction and in a sub scanning direction; a second exposure head in which a plurality of light emitting sections which emit light with second intensity are arranged in the main scanning direction and in the sub scanning direction in such a way that an exposure area including an overlapped exposure area overlapping an exposure area of the first exposure head is exposed by the second exposure head; and a driving control unit by which each of the light emitting sections of the first exposure head and the second exposure head is lit at a predetermined timing in the overlapped exposure area in such a way that a difference in the maximum exposure amount between pixels adjoining each other in the main scanning direction is smaller than a difference in the maximum exposure amount between each pixel in the exposure area of the first exposure head and each pixel in the exposure area of the second exposure head.

The first exposure apparatuses according to the invention comprises: the first exposure head in which a plurality of light emitting sections which emit light with first intensity are arranged in the main scanning direction and in the sub scanning direction; and the second exposure head in which a plurality of light emitting sections which emit light with second intensity are arranged in the main scanning direction and in the sub scanning direction. In each of the first exposure head and the second exposure head, multiple exposure of the same pixel on a photosensitive material is executed, using a plurality of the light emitting sections arranged in the sub scanning direction. When there is a difference in the first intensity and the second intensity, there is also the difference in the maximum exposure amount by the first exposure head and that by the second exposure head.

The second exposure head is arranged in such a way that the area including the overlapped exposure area overlapping the exposure area of the first exposure head is exposed. The light emitting sections of the first exposure head and the second exposure head are lit by the driving control unit at a predetermined timing. At this time, the light emitting sections are lit in the overlapped exposure area in such a way that the difference in the maximum exposure amount between pixels adjoining each other in the main scanning direction is smaller than the difference in the maximum exposure amount of pixels in the exposure area between the first exposure head and the second exposure head. Thereby, even when there is the difference between the maximum exposure amount by the first exposure head and that by the second one, the difference is not visible between the pixel adjoining each other in the main scanning direction, and generation of "stripe-shaped unevenness" is controlled in an exposed image.

In the above-described first exposure apparatuses, monotone increasing or decreasing of the maximum exposure amount of pixels in the overlapped exposure area is preferably executed in the main scanning direction. There is little generation of "stripe-shaped unevenness" in an exposed image by monotone increasing or decreasing of the maximum exposure amount, because the maximum exposure amount is smoothly changed in the overlapped exposure areas even when there is the difference between the maximum exposure amount by the first exposure head and that by the second one. One of methods for monotone increasing or decreasing of the maximum exposure amount is realized by changing a ratio between the number of light emitting sections which emit light with the first intensity and that of light emitting sections which emit light with the second intensity in a plurality of light emitting sections corresponding to the overlapped exposure area.

Second Exposure Apparatus

In order to achieve the above-described object, a second exposure apparatuses according to the invention comprises: a first exposure head in which a plurality of light emitting sections which emit light with first intensity are arranged in a main scanning direction and in a sub scanning direction; and a second exposure head in which a plurality of light emitting sections which emit light with second intensity are arranged in the main scanning direction and in the sub scanning direction in such a way that an exposure area including an overlapped exposure area overlapping an exposure area of the first exposure head is exposed by the second exposure head, wherein the light emitting sections which emit light with the first intensity and the light emitting sections which emit light with the second intensity are provided in a predetermined ratio corresponding to the overlapped exposure area in such a way that a difference in the maximum exposure amount between pixels adjoining each other in the main scanning direction is smaller than a difference in the maximum exposure amount between each pixel in the exposure area of the first exposure head and each pixel in the exposure area of the second exposure head. In this case, it is also preferable that monotone increasing or decreasing of the maximum exposure amount of pixels in the overlapped exposure area is executed in the main scanning direction.

The second exposure apparatuses according to the invention comprises: the first exposure head in which a plurality of light emitting sections which emit light with the first intensity are arranged in the main scanning direction and in the sub scanning direction; and the second exposure head in which a plurality of light emitting sections which emit light with the second intensity are arranged in the main scanning direction and in the sub scanning direction in such a way that the area including the overlapped exposure area overlapping the exposure area of the first exposure head is exposed. In each of the first and the second exposure heads, multiple exposure of the same pixel on a photosensitive material is executed, using a plurality of the light emitting sections arranged in the sub scanning direction. When there is the difference in the first intensity and the second intensity, there is also the difference in the maximum exposure amount by the first exposure head and that by the second exposure head.

The second exposure head is arranged in such a way that the area including the overlapped exposure area overlapping the exposure area of the first exposure head is exposed. In the first and second exposure head, the light emitting sections which emit light with the first intensity and the light emitting sections which emit light with the second intensity are provided in a predetermined ratio corresponding to the overlapped exposure area in such a way that the difference in the maximum exposure amount between pixels adjoining each other in the main scanning direction is smaller than the difference in the maximum exposure amount of pixels in the exposure area between the first exposure head and the second exposure head. Thereby, even when there is the difference between the maximum exposure amount by the first exposure head and that by the second one, the difference is not visible between the pixel adjoining each other in the main scanning direction, and generation of "stripe-shaped unevenness" is controlled in an exposed image.

Third Exposure Apparatus

In order to achieve the above-described object, a third exposure apparatuses according to the invention comprises: a first exposure head in which a plurality of light emitting sections are arranged in a main scanning direction and in a sub scanning direction; a second exposure head in which a plurality of light emitting sections are arranged in the main scanning direction and in the sub scanning direction in such a way that an exposure area including an overlapped exposure area overlapping an exposure area of the first exposure head is exposed by the second exposure head, and a driving control unit by which each of the light emitting sections of the first exposure head and the second exposure head is lit with predetermined light emitting intensity and at a predetermined timing in such a way that a difference in the maximum exposure amount between pixels adjoining each other in the main scanning direction is smaller than a difference in the maximum exposure amount between each pixel in the exposure area of the first exposure head and each pixel in the exposure area of the second exposure head.

The third exposure apparatuses according to the invention comprises: the first exposure head in which a plurality of light emitting sections are arranged in the main scanning direction and in the sub scanning direction; and the second exposure head in which a plurality of light emitting sections are arranged in the main scanning direction and in the sub scanning direction. In each of the first exposure head and the second exposure head, multiple exposure of the same pixel on a photosensitive material is executed, using a plurality of the light emitting sections arranged in the sub scanning direction.

The second exposure head is arranged in such a way that the area including the overlapped exposure area overlapping the exposure area of the first exposure head is exposed. The light emitting sections of the first and second exposure heads are lit by the driving control unit with the predetermined light emitting intensity and at the predetermined timing. At this time, the light emitting sections are lit in the overlapped exposure area in such a way that the difference in the maximum exposure amount between pixels adjoining each other in the main scanning direction is smaller than the difference in the maximum exposure amount of pixels in the exposure area between the first exposure head and the second exposure head. Thereby, even when there is the difference between the maximum exposure amount by the first exposure head and that by the second one, the difference is not visible between the pixel adjoining each other in the main scanning direction, and generation of "stripe-shaped unevenness" is controlled in an exposed image.

In the above-described third exposure apparatuses, monotone increasing or decreasing of the maximum exposure amount of pixels in the overlapped exposure area is preferably executed in the main scanning direction. One of methods for monotone increasing or decreasing of the maximum exposure amount is realized by changing a ratio between the light emitting intensity of the light emitting sections in the first exposure head and that of the light emitting sections in the second exposure head in a plurality of light emitting sections corresponding to the overlapped exposure area.

Here, it is preferable to provide a common electrode in the above-described first to third exposure apparatuses in such a way that a plurality of light emitting sections which are arranged in a different direction from the sub scanning direction are driven. The light emitting sections arranged in the sub scanning direction are used for multiple exposure and, if a common electrode is arranged for the light emitting sections in the sub scanning direction, all the light emitting sections on one line in the sub scanning direction can not be lit to generate "stripe-shaped unevenness" when one electrode cable is disconnected. On the other hand, if a common electrode is provided for the light emitting sections arranged in a different direction (for example, in a diagonal direction) from the sub scanning direction, only one of the light emitting sections in the sub scanning direction can not be lit even if one electrode cable is disconnected, and generation of "stripe-shaped unevenness" by the disconnection can be controlled.

Fourth Exposure Apparatus

In order to achieve the above-described object, a fourth exposure apparatuses according to the invention comprises: a first exposure head in which a plurality of light emitting sections which emit light with first intensity are arranged in a main scanning direction and in a sub scanning direction; a second exposure head in which a plurality of light emitting sections which emit light with second intensity are arranged in the main scanning direction and in the sub scanning direction in such a way that an exposure area including an overlapped exposure area overlapping an exposure area of the first exposure head is exposed by the second exposure head, wherein in light emitting sections in the first exposure head, which are disposed correspondingly to the overlapped exposure area, number of the light emitting sections which are used for exposure gradually decreases towards the downstream side in the main scanning direction and towards the downstream side of the sub scanning direction, and in light emitting sections in the second exposure head, which are disposed correspondingly to the overlapped exposure area, number of the light emitting sections which are used for exposure gradually increases towards the downstream side in the main scanning direction and towards the downstream side of the sub scanning direction.

Fifth Exposure Apparatus

In order to achieve the above-described object, a fifth exposure apparatuses according to the invention comprises: a first exposure head in which a plurality of light emitting sections which emit light with first intensity are arranged in a main scanning direction and in a sub scanning direction; a second exposure head in which a plurality of light emitting sections which emit light with second intensity are arranged in the main scanning direction and in the sub scanning direction in such a way that an exposure area including an overlapped exposure area overlapping an exposure area of the first exposure head is exposed by the second exposure head, wherein in light emitting sections in the first exposure head, which are disposed correspondingly to the overlapped exposure area, light emitting intensity of the light emitting sections which are used for exposure gradually decreases towards the downstream side in the main scanning direction and towards the downstream side of the sub scanning direction, and in light emitting sections in the second exposure head, which are disposed correspondingly to the overlapped exposure area, light emitting intensity of the light emitting sections which are used for exposure gradually increases towards the downstream side in the main scanning direction and towards the downstream side of the sub scanning direction.

Exposure Method

In order to achieve the above-described object, in an exposure method according to the invention, by using a first exposure head and a second exposure head, the second exposure head in which a plurality of light emitting sections are arranged in a main scanning direction and in a sub scanning direction being arranged in such a way that an exposure area including an overlapped exposure area overlapping an exposure area of the first exposure head in which a plurality of light emitting sections are arranged in the main scanning direction and in the sub scanning direction is exposed by the second exposure head, the photosensitive material is exposed in the overlapped exposure area in such a way that a difference in the maximum exposure amount between pixels adjoining each other in the main scanning direction is smaller than a difference in the maximum exposure amount between each pixel in the exposure area of the first exposure head except for the overlapped exposure area and each pixel in the exposure area of the second exposure head except for the overlapped exposure area.

When there is a remarkable difference in the maximum exposure amount between pixels adjoining each other in the main scanning direction, for example, as shown in FIG. 10A, a remarkable difference in the exposure density between the pixels adjoining each other is caused, and the difference is visually identified to cause "stripe-shaped unevenness" in an exposed image. According to the invention, even when there is the remarkable difference in the maximum exposure amount between the first exposure head and the second exposure head, the difference is not visible between the pixel adjoining each other in the main scanning direction, for example, by gradual changing of the maximum exposure amount over a plurality of pixels arranged in the main scanning direction, as shown in FIG. 10B in order not to generate the remarkable difference in the exposure density between the pixels adjoining each other. Thereby, "stripe-shaped unevenness" is not visually identified.

BRIEF DESCRIPTION OF THE DRAWINGS

FIG. 9 is a schematic view showing an arrangement of exposure heads in a previous multihead-type exposure apparatuses.

DETAILED DESCRIPTION OF THE INVENTION

Hereinafter, embodiments according to the present invention will be explained in detail, referring to drawings.

First Embodiment

[Configuration of Exposure Head]

Figure 1:
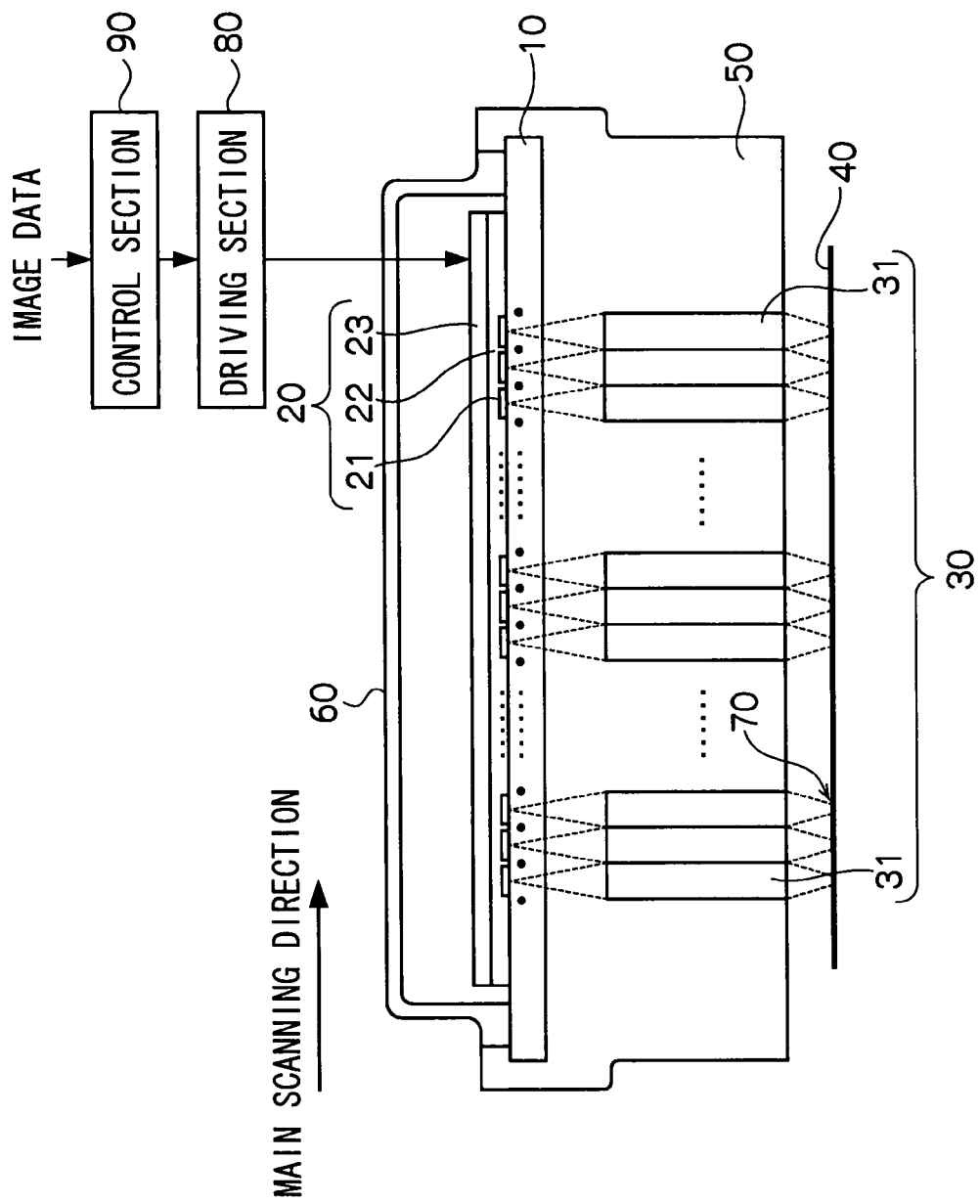
FIG. 1 is a cross section showing a configuration of an exposure head in an exposure apparatuses according to a first embodiment of the present invention.

An exposure apparatuses according to a first embodiment is provided with a plurality of exposure heads comprising: a transparent substrate 10; a plurality of organic EL elements 20 which are formed on the transparent substrate 10 and include a light emitting section; a SELFOC lens array (hereinafter, called as "SLA") 30 by which light from each light emitting section of the organic EL elements 20 is focused for radiation on a photosensitive material 40; a supporting structure 50 supporting the transparent substrate 10 and SLA 30, as shown in FIG. 1.

The organic EL elements 20 are formed in such a way that a transparent electrode 21 as an anode, an organic compound layer 22 including a light emitting layer, and a metal electrode 23 as a cathode are laminated one by one on the transparent substrate 10. The transparent electrodes 21 and the metal electrodes 23 are patterned to form lines, respectively, in such a way that the lines of the transparent electrodes 21 (anode lines) and the lines of the metal electrode 23 (cathode lines) are intersecting one another according to a layout of the light emitting sections. Here, the light emitting sections can be arranged in a m by n matrix.

The organic EL elements 20 are covered with a sealing component 60 such as a stainless steel can, and are sealed in the sealing component 60 filled with dry nitrogen gas, while an edge part of the sealing component 60 and the transparent substrate 10 are bonded together with an adhesive. When a predetermined current is applied between the transparent electrodes 21 and the metal electrodes 23 in the organic EL elements 20, the light emitting layers included in the organic compound layers 22 which are located in intersecting parts of the anode lines and the cathode lines emit light for output through the transparent electrodes 21 and the transparent substrates 10.

Moreover, both of the transparent electrodes 21 and the metal electrodes 23 are connected to a driving section 80 which separately drives a plurality of the light emitting sections. The driving section 80 is configured to include a power supply (not shown) for applying a voltage between the both electrodes and a switching element (not shown) comprising transistors and thyristors.

The above-described driving section 80 is connected to a control section 90 provided with CPU (central processing unit), ROM (read only memory) for storing various kinds of the after-described processing routines, RAM (random access memory), and a data input/output section. The control section 90 generates a control signal which controls the organic EL elements 20 for driving, and the driving section 80 controls the elements 20 (the light emitting sections, to be exact) for modulation, based on the control signal from the control section 90.

The modulation method may be any one of pulse width modulation based on a predetermined current, pulse width modulation based on a predetermined voltage, pulse number modulation based on a predetermined current or on a predetermined voltage, or intensity modulation. Moreover, a plurality of the modulation methods can be suitably applied together. Furthermore, the organic EL element is basically a current driven element, and current driven modulation for modulation driving by changing a driving current has better stability in the temperature characteristics and in the driving characteristics with time, in comparison with voltage driven modulation for modulation driving by changing a driving voltage. Accordingly, the current driven modulation is more preferable.

The transparent substrate 10 is a substrate which is transparent to emitted light, and a glass substrate, a plastic substrate and the like can be used for the substrate 10. Moreover, the transparent substrate 10 requires similar characteristics in thermal resistance, dimensional stability, solvent resistance, electric insulation, workability, low gas permeability, low hygroscopicity and the like to those of a general substrate.

The transparent electrode 21 (anode) has a light transmittance of at least 50% or more, preferably, 70% or more in a visible wavelength range of 400 nm to 700 nm. As a material forming the transparent electrode 21, there may be used a thin metal film with a large work function such as gold and platinum, as well as tin oxide, indium tin oxide (ITO), and indium zinc oxide, which are well known as a material for a transparent electrode. Furthermore, an organic compound such as polyaniline, polythiophene, polypyrrole, or, these derivatives may be accepted. A transparent conductive film, which has been described in detail in "Developments of Transparent Conductive Films", edited by Yutaka SAWADA, published by CMC Publishing Co., Ltd., 1999, may be applied to the invention. Moreover, the transparent electrode 21 can be formed on the transparent substrate 10 by a method such as a vacuum evaporation method, a sputtering method, and an ion plating method.

The organic compound layer 22 may be of a single layer structure comprising only a light emitting layer, or of a laminated structure which suitably has other layers such as a hole injection layer, a hole transport layer, an electron injection layer, and an electron transport layer, other than the light emitting layer. One concrete configuration (including the electrodes for display) of the organic compound layer 22 may comprise an anode, a hole injection layer, a hole transport layer, a light emitting layer, an electron transport layer, a cathode and an anode, a light emitting layer, an electron transport layer, a cathode and an anode, a hole transport layer, a light emitting layer, an electron transport layer, and a cathode, and the like laminated in this order.

Moreover, a plurality of light emitting layers, hole transport layers, hole injection layers, and electron injection layers may be included.

In the organic EL element 20, the color of emitted light depends on materials of the organic compound layer. Accordingly, the organic EL element 20 provided with a plurality of organic EL elements which realize any one of colors of RGB (red green blue) for emitted light can be obtained by application of different materials to the organic compound layers in each element. Materials which have been well known so far can be suitably used for each component layer, such as a hole transport layer, an electron transport layer, a light emitting layer, and a conductive polymer layer, in the organic compound layer. Moreover, each component layer can be formed by a well known method such as a vacuum evaporation method, a sputtering method, a dipping method, a spin coating method, a casting method, a bar coating method, and a roll coating method. Furthermore, multilayer coating can be executed by suitable use of different kinds of solvents.

Preferably, the metal electrode 23 (cathode) comprises a metal material such as an alkali metal such as Li and K, an alkaline-earth metal such as Mg and Ca, which have a low work function, an alloy of these metals with Ag or Al, and a mixture of them. In order to realize compatibility between the preservation stability and the easiness in electron injection for an cathode, the electrode made of the above-described material may be further coated with Ag, Al, Au, and the like with a large function and good dielectric properties. Here, the metal electrode 23 can be formed by a well known method such as a vacuum evaporation method, a sputtering method, and an ion plating method in a similar manner to that of the transparent electrode 21. Moreover, the metal electrode 23 may be formed with a transparent conductive film in a similar manner to that of the transparent electrode 21.

SLA 30 comprises a plurality of SELFOC lenses 31. The SELFOC lenses 31 are a cylinder-shape thick-walled lens with a refractive index distribution in the radial direction of the section. Light which enters the SELFOC lenses 31 travels under sinusoidal meandering to an optical axis for output to the photosensitive material 40 in such a way that the light is focused on the surface of the material to form exposure spots.

Moreover, in order to control optical crosstalk by narrowing the exposure spots, the sizes of opening sections of the SELFOC lenses 31 are formed larger than those of the light emitting areas of the organic EL elements 20, and the adjoining SELFOC lenses 31 are arranged in such a way that the lenses are in contact with each other. Here, the SELFOC lenses 31 may be provided in one to one correspondence to the organic EL elements of the organic EL elements 20, or may be installed in one to N (N is an integer of two or more) correspondence to a plurality of the organic EL elements arranged in the sub scanning direction.

[Arrangement of Exposure Head]

Figure 2:
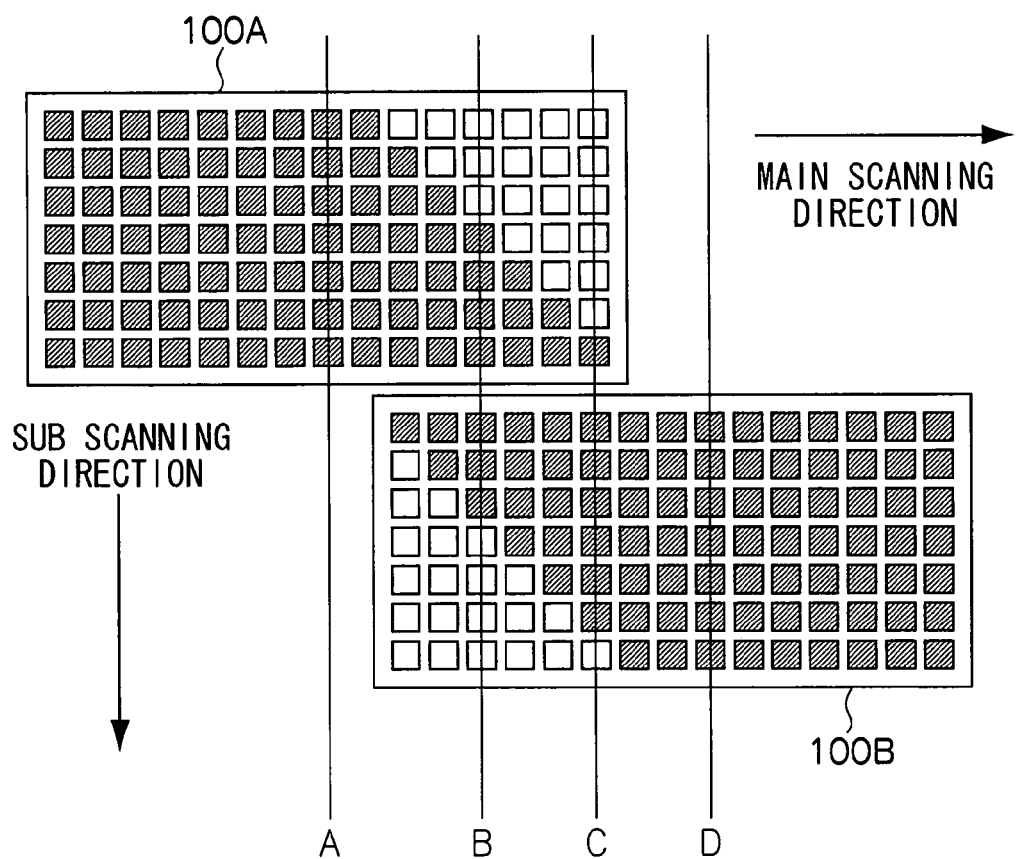
FIG. 2 is a plan view showing an arrangement of the exposure heads, a layout of light emitting sections including organic EL elements, and a lighting method of the light emitting sections in the exposure apparatuses according to the first embodiment.

As shown in FIG. 2, in the exposure apparatuses according to the first embodiment, an exposure head 100A and an exposure head 100B, which are provided with rectangular substrates, are provided. The exposure 100A and the exposure head 100B are provided such that the longitudinal direction of the exposure head 100A and that of the exposure head 100B are arranged in the main scanning direction, and the exposure head 100A is located on the upstream side to the exposure head 100B in the sub scanning direction. Moreover, the exposure head 100A is displaced from the exposure head 100B in the main scanning direction in such a way that exposure areas by the both heads partially overlap each other. Hereinafter, areas in the exposure heads, in which light emitting sections are arranged corresponding to the overlapped exposure areas, are called as "overlapped area".

In FIG. 2, each of the exposure head 100A and the exposure head 100B comprises 105 light emitting sections which are arranged in a 15 by 7 matrix (15 rows and 7 columns) Further, the two exposure heads 100A, 100B are displaced from each other in the main scanning direction in such a way that six columns of light emitting sections on the downstream side in the main scanning direction in the exposure head 100A and six columns of light emitting sections on the upstream side in the main scanning direction in the exposure head 100B adjoin each other in the sub scanning direction. In this example, an area in which the above-described six columns of the light emitting sections in the exposure head 100A are arranged and an area in which the above-described six columns of the light emitting sections in the exposure head 100B are arranged are "overlapped area". Here, a supporting component 50 and the sealing component 60 are not shown in FIG. 2.

[Exposure Processing Based On Image Data]

Then, exposure operations for exposing a photosensitive material with the above-described exposure apparatuses will be explained. As the photosensitive material 40 is carried by a not-shown carrying mechanism in such a way that the carrying direction and the main scanning direction intersect, the light emitting sections of the organic EL elements 20 in each of the exposure head 100A and the exposure head 100B are lit by the driving section 80 at a predetermined timing according to a control signal which is generated based on an image data, and a same position of the photosensitive material 40 is exposed (multiple exposure) one by one by the plurality of the light emitting sections arranged in the sub scanning direction. The multiple exposure by a plurality of the light emitting sections can supply enough exposure energy to the photosensitive material 40.

In FIG. 2, light emitting sections which are used for exposure are shown in a black color, and light emitting sections which are not used for exposure are shown in a white color. As will be explained later, in the embodiment, only a part of the light emitting sections are lit in the above-described overlapped area. That is, among the light emitting sections in the exposure head 100A, only the light emitting sections, which are used for exposure and are shown in a black color, are lit in such a way that the number of the sections which are lit is gradually decreasing towards the downstream side in the main scanning direction and towards the downstream side of the sub scanning direction. Moreover, among the light emitting sections in the exposure head 100B, only the light emitting sections, which are used for exposure and are shown in a black color, are lit in such a way that the number of the sections which are lit is gradually increasing towards the downstream side in the main scanning direction and towards the downstream side of the sub scanning direction. However, the total number of the light emitting sections which are used for the exposure is assumed to be a constant (seven in FIG. 2) in the sub scanning direction.

When it is assumed that an exposure amount of each pixel on the photosensitive material 40 caused by individual light emitting sections in the exposure head 100A is HA, and an exposure amount of each pixel on the photosensitive material 40 caused by individual light emitting sections in the exposure head 100B is HB, the maximum exposure amount of each pixel on a line A is 7HA because multiple exposure of each pixel on the line A has been executed by seven light emitting sections arranged in the sub scanning direction. Moreover, the maximum exposure amount of each pixel on a line B is 4HA+3HB, that of each pixel on a line C is HA+6HB, and that of each pixel on a line D is 7HB.

When the exposure amount HB is assumed to be smaller than the exposure amount HA, the maximum exposure amount of each pixel gradually decreases along the main scanning direction as shown in the following formula: 7HA>4HA+3HB>HA+6HB>7HB. Therefore, even if there is a difference in the light emitting intensity of the light emitting sections between the exposure heads 100A and 100B, a joint in an exposure image (an exposed image)is not visually identified because the maximum exposure amount is gradually changed in the overlapped exposure areas.

As described above, since the light emitting sections in the overlapped areas are lit in such a way that the maximum exposure amount of each pixel arranged in the main scanning direction is gradually changed in the overlapped exposure areas, an preferable image in which it is difficult to notice a joint can be obtained in the exposure apparatus according to the embodiment even when a plurality of exposure heads are arranged for exposure of a large area.

Figure 3:
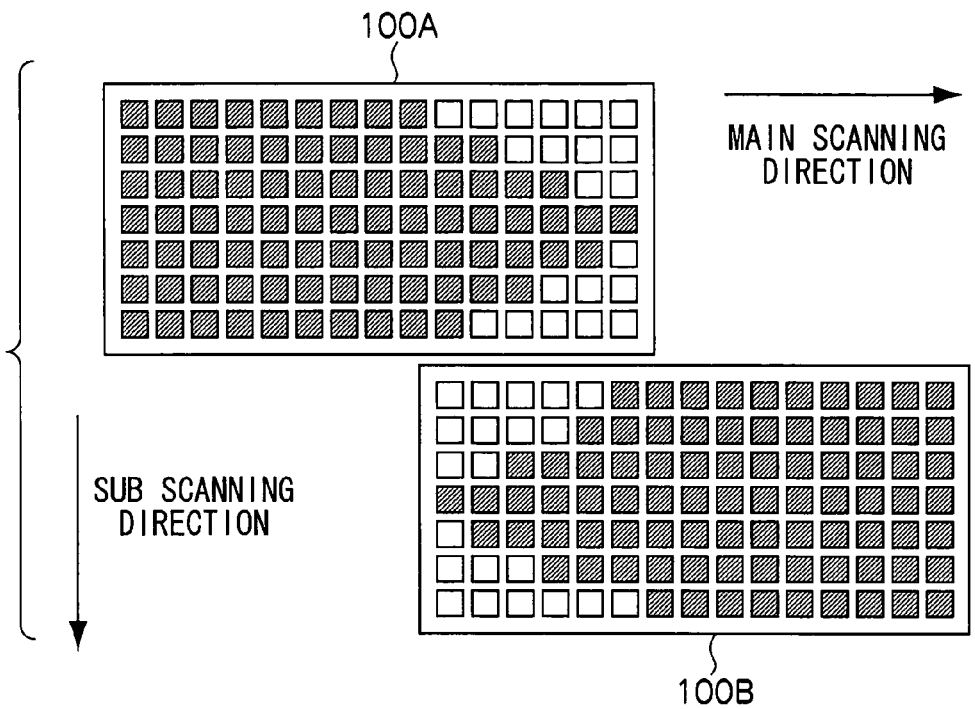
FIG. 3 is a plan view showing another lighting method of the light emitting sections.
Figure 4:
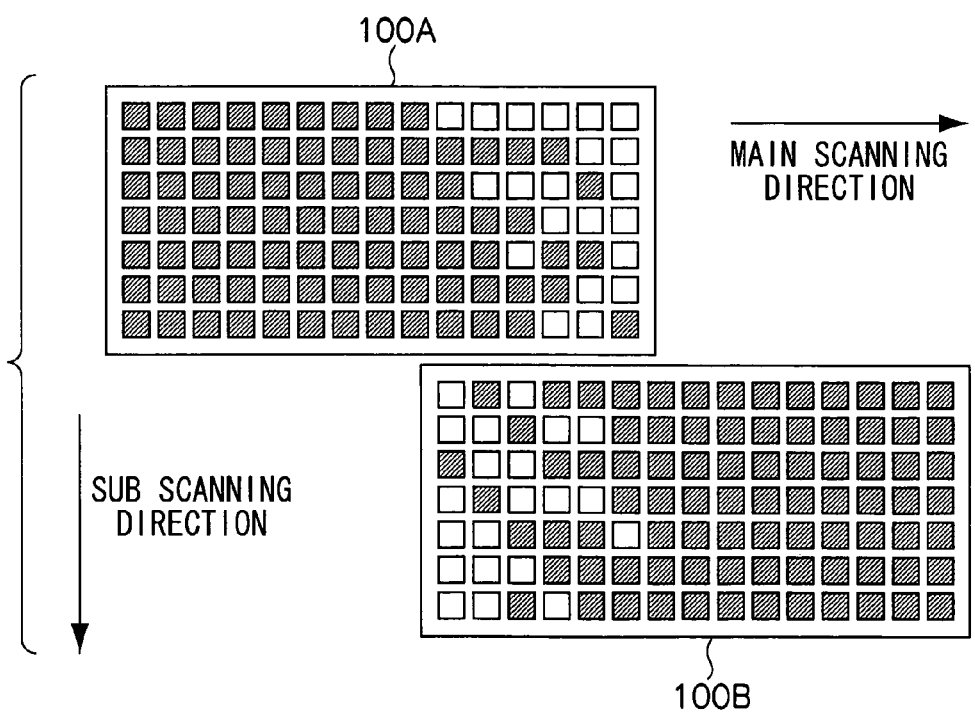
FIG. 4 is a plan view showing further another lighting method of the light emitting sections.

Here, the lighting method of the light emitting sections in the overlapped area is not limited to the above-described one. For example, based on assumption that the number of the light emitting sections used for exposure is a constant in the sub scanning direction, the number of light emitting sections which are lit may gradually increase or decrease towards the downstream side in the main scanning direction and towards the downstream side of the sub scanning direction and towards the center of the exposure head as shown in FIG. 3, or may randomly increase or decrease towards the downstream side in the main scanning direction and towards the downstream side of the sub scanning direction as shown in FIG. 4.

Second Embodiment

Figure 5:
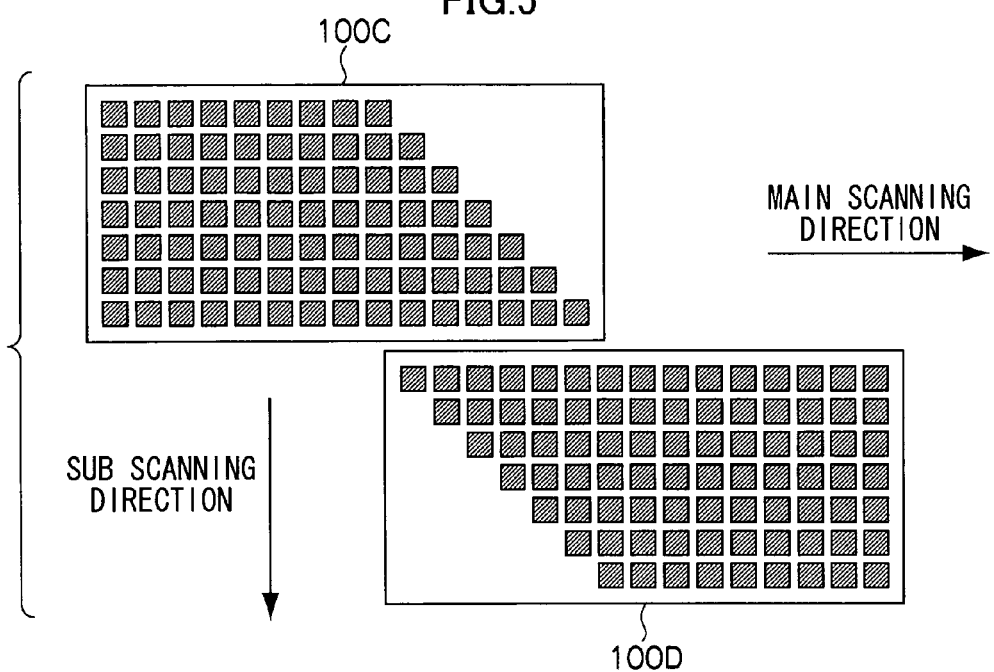
FIG. 5 is a plan view showing an arrangement of exposure heads, a layout of light emitting sections including organic EL elements, and a lighting method of the light emitting sections in an exposure apparatuses according to a second embodiment.

An exposure apparatuses according to a second embodiment has a configuration, as shown in FIG. 5, in which a layout of light emitting sections in an organic EL element is changed in such a way that light emitting sections which are not used for exposure are not provided from the beginning. Since the above configuration is similar to the exposure apparatuses according to the first embodiment, except the above changed layout, explanation for the similar parts will be omitted.

In FIG. 5, each of exposure heads 100C, 100D has 84 pieces of light emitting sections which are arranged in a 15 by 7 matrix. However, as hereinafter will be described, one corner is missing in each matrix. Further, the two exposure heads 100C, 100D are displaced from each other in the main scanning direction in such a way that six columns of light emitting sections on the downstream side in the main scanning direction in the exposure head 100C and six columns of light emitting sections on the upstream side in the main scanning direction in the exposure head 100D adjoin each other in the sub scanning direction. In this example, an area in which the above-described six columns the light emitting sections in the exposure head 100C are arranged, and an area in which the above-described six columns of the light emitting sections in the exposure head 100D are arranged are "overlapped area". Here, a supporting component 50 and a sealing component 60 are not shown in FIG. 5.

In the embodiment, as hereinafter will be explained, the number of light emitting sections which are arranged in the above-described overlapped area increases or decreases. That is, the number of the sections in the exposure head 100C is gradually decreasing towards the downstream side in the main scanning direction and towards the downstream side of the sub scanning direction. Moreover, the number of the sections in the exposure head 100D is gradually increasing towards the downstream side in the main scanning direction and towards the downstream side of the sub scanning direction. However, the sum of the numbers of the light emitting sections for the both exposure heads is a constant (seven in FIG. 5) in the sub scanning direction.

When, assuming that an exposure amount of each pixel on the photosensitive material 40 caused by individual light emitting sections in the exposure head 100C is HC, and an exposure amount of each pixel on the photosensitive material 40 caused by individual light emitting sections in the exposure head 100D is HD, the exposure amount HD is smaller than the exposure amount HC, the maximum exposure amount of each pixel gradually decreases along the main scanning direction. Therefore, since the maximum exposure amount is gradually changed in an overlapped exposure area even if there is a difference in the light emitting intensity of the light emitting sections between the exposure heads 100C and 100D, a joint in an exposure image is not visually identified in a similar manner to that of the first embodiment.

As described above, since the light emitting sections in the overlapped areas are arranged in such a way that the maximum exposure amount of each pixel arranged in the main scanning direction is gradually changed in the overlapped exposure area, an preferable image in which it is difficult to notice a joint can be obtained in the exposure apparatuses according to the embodiment even when a plurality of exposure heads are arranged for exposure of a large area.

Here, the arrangement method of the light emitting sections in the overlapped area is not limited to the above-described one. For example, based on assumption that the number of the light emitting sections used for exposure is a constant in the sub scanning direction, the light emitting sections can be arbitrarily arranged in a similar manner to that of the first embodiment.

Third Embodiment

Figure 6:
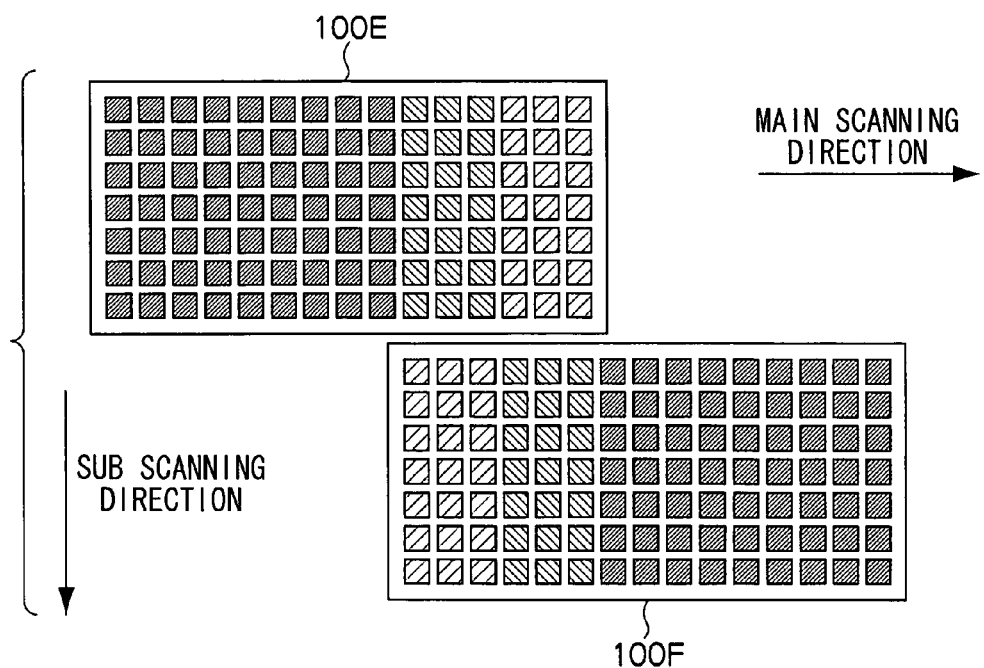
FIG. 6 is a plan view showing an arrangement of exposure heads, a layout of light emitting sections including organic EL elements, and a lighting method of the light emitting sections in an exposure apparatuses according to a third embodiment.

In an exposure apparatuses according to a third embodiment, a light-emitting intensity distribution is provided for each organic El element, as shown in FIG. 6. That is, light-emitting intensities of light emitting sections are not the same. Since the above exposure apparatuses according to the third embodiment is similar to the exposure apparatuses according to the first embodiment, except the above distribution, explanation for the similar parts will be omitted.

In FIG. 6, each of the exposure head 100E and the exposure head 100F comprises 105 light emitting sections which are arranged in a 15 by 7 matrix. Further, the two exposure heads 100E, 100F are displaced from each other in the main scanning direction in such a way that six columns of light emitting sections on the downstream side in the main scanning direction in the exposure head 100E and six columns of light emitting sections on the upstream side in the main scanning direction in the exposure head 100F adjoin each other in the sub scanning direction. In this example, an area in which the above-described six columns of the light emitting sections in the exposure head 100E are arranged, and an area in which the above-described six columns of the light emitting sections in the exposure head 100F are arranged are "overlapped area". Here, a supporting component 50 and a sealing component 60 are not shown in FIG. 2.

In the embodiment, as hereinafter will be explained, the light emitting sections are lit according to a predetermined light-emitting intensity distribution in the above-described overlapped area. That is, among the light emitting sections in the exposure head 100E, the light-emitting intensity is gradually decreasing towards the downstream side in the main scanning direction and towards the downstream side of the sub scanning direction. Moreover, among the light emitting sections in the exposure head 100F, light-emitting intensity is gradually increasing towards the downstream side in the main scanning direction and towards the downstream side of the sub scanning direction.

When it is assumed that an exposure amount of each pixel on the photosensitive material 40 caused by individual light emitting sections in the exposure head 100E is HE, an exposure amount of each pixel on the photosensitive material 40 caused by individual light emitting sections in the exposure head 100F is HF, and the light-emitting intensity of each light emitting section is changed in seven levels , the maximum exposure amount of each pixel on a line A in the sub scanning direction is 7HE. Similarly, that of each pixel on a line B is 4HE+3HF, that of each pixel on a line C is HE+6HF, and that of each pixel on a line D is 7HF. When it is assumed that the exposure amount HF is smaller than the exposure amount HE, the maximum exposure amount of each pixel gradually decreases along the main scanning direction as shown in the following formula: 7HE >4HE+ 3HF>HE+6HF>7HF. Therefore, since the maximum exposure amount is gradually changed in an overlapped exposure areas even if there is a difference in the light emitting intensity of the light emitting sections between the exposure heads 100E and 100F, a joint in an exposure image is not visually identified in a similar manner to that of the first embodiment.

As described above, since the light emitting sections in the overlapped areas are lit with different light-emitting intensity in such a way that the maximum exposure amount of each pixel arranged in the main scanning direction is gradually changed in the overlapped exposure area, an preferable image in which it is difficult to notice a joint can be obtained in the exposure apparatuses according to the embodiment even when a plurality of exposure heads are arranged for exposure of a large area.

Here, though there has been explained an example in which the maximum exposure amount of each pixel arranged in the main scanning direction is gradually changed in the overlapped exposure area by providing a light-emitting intensity distribution for each light emitting section in the overlapped areas, the maximum exposure amount of each pixel may be changed by changing the light emitting time of each light emitting section. Moreover, instead of providing the light-emitting intensity distribution for each light emitting section, an optical filter with a density distribution, which is corresponding to a predetermined intensity distribution, may be inserted between the organic EL elements and the photosensitive material in such a way that exposed light has the predetermined intensity distribution.

As described above, when exposure of a large area is executed, using a plurality of exposure heads, an preferable image in which it is difficult to notice "stripe-shaped unevenness" which is seemed to be a joint can be obtained in the exposure apparatuses and the exposure method according to the invention even if there is a difference in the light emitting intensity of the light emitting sections between the exposure heads. That is, generation of "stripe-shaped unevenness" can be controlled in an exposed image and an image with high image quality can be obtained even when long use of the exposure heads causes the unevenness in the light-emitting intensity among the heads, or the unevenness in the light emitting intensity among the exposure heads is caused by an environmental temperature.

Variation Example etc.

Figure 7:
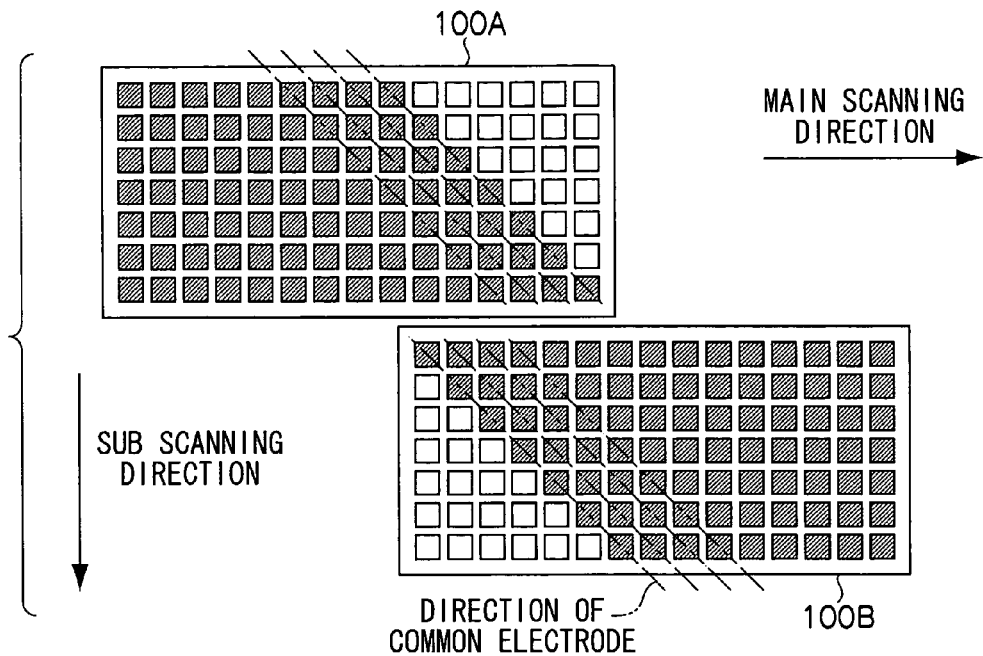
FIG. 7 is a plan view showing an arrangement method of a common electrode for preventing an effect by disconnection in an electrode cable.

Here, although the arrangement of the electrodes in the organic EL elements has not been explained in detail in the first to third embodiments, it is preferable to make either of the anode or the cathode electrode a common electrode for light emitting sections (the light emitting sections are diagonally arranged) arranged over a plurality of columns in a matrix, as shown in FIG. 7 by dashed lines. The light emitting sections arranged in the sub scanning direction are used for multiple exposure and, if a common electrode is provided for the light emitting sections in the sub scanning direction, all the light emitting sections on one line in the sub scanning direction can not be lit to generate "stripe-shaped unevenness" when one electrode cable is disconnected. On the other hand, if a common electrode is provided for the light emitting sections in the diagonal direction, only one of the light emitting sections in the sub scanning direction can not be lit even if one electrode cable is disconnected, and a preferable image without "stripe-shaped unevenness" can be obtained.

Figure 8:
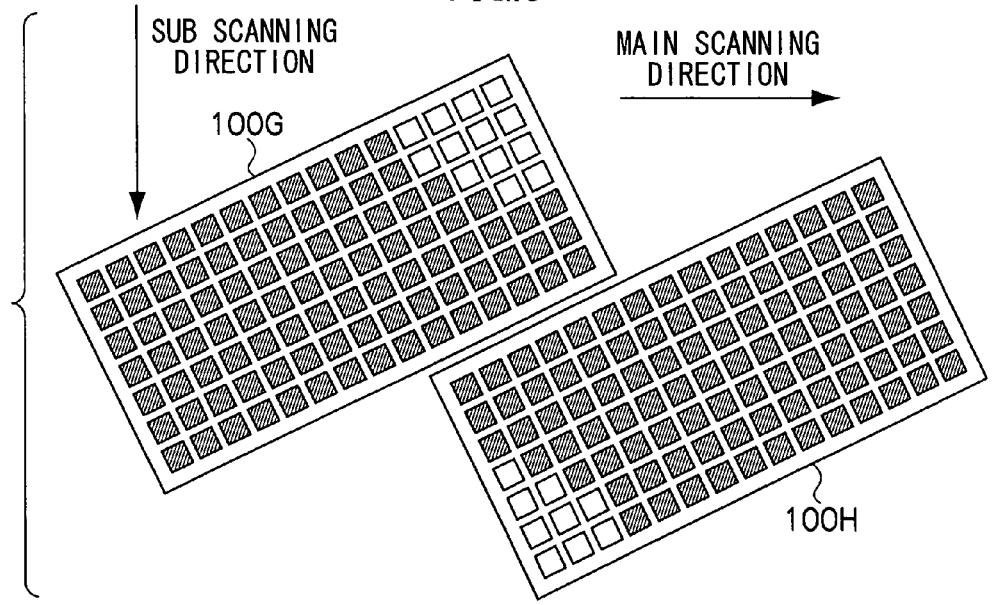
FIG. 8 is a plan view showing an arrangement method of exposure heads for preventing an effect by disconnection in an electrode cable.
Figure 10A:
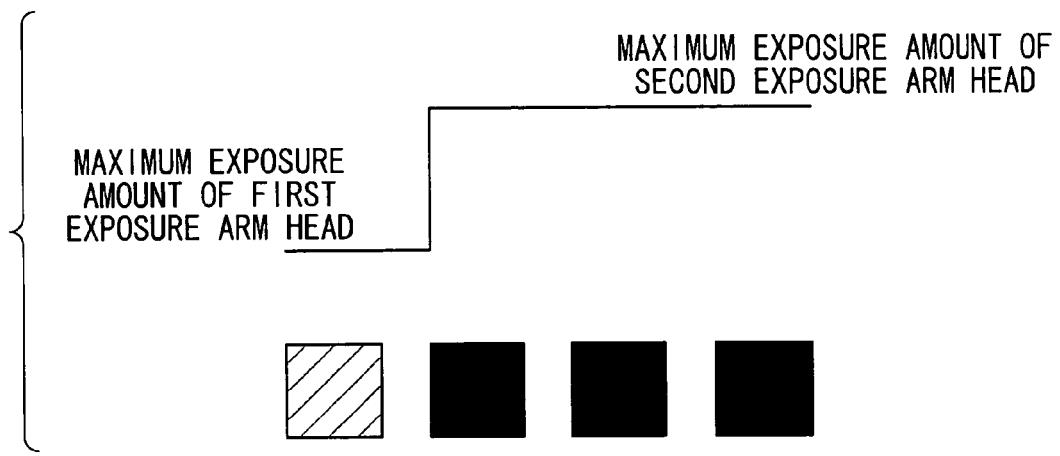
FIG. 10A is a view showing an abrupt change in a maximum exposure amount between pixels adjoining each other when "stripe-shaped unevenness" is generated.
Figure 10B:
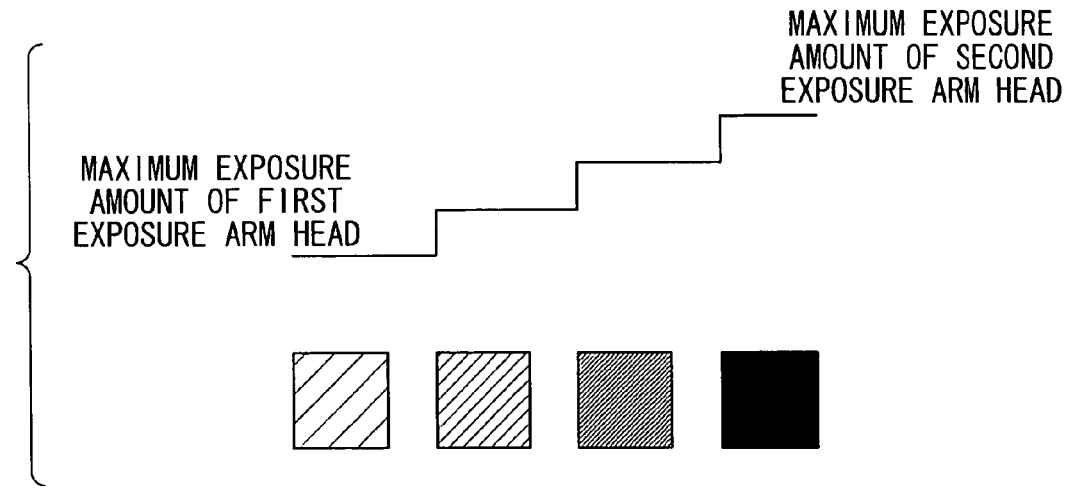
FIG. 10B is a view showing a gradual change in the maximum exposure amount between pixels adjoining each other according to the invention.

Moreover, similarly, generation of stripe-shaped unevenness by disconnection of an electrode cable can be prevented by a configuration in which an exposure head 100G and an exposure head 100H in which a plurality of light emitting sections are formed in a matrix, are arranged at a predetermined angle to the main scanning direction as shown in FIG. 8. Since the number of the light emitting sections arranged in the sub scanning direction is different in this case, exposure is executed in a similar manner to that of the first to third embodiments in such a way that the maximum exposure amount of each pixel arranged in the main scanning direction is gradually changed.

Moreover, in the first to third embodiments, there has been explained an example in which organic EL elements comprising a plurality of light emitting sections are used for an exposure head, but the light emitting sections may comprise another type of light emitting element. For example, a light emitting element such as a semiconductor laser, a light emitting diode (LED), and an inorganic EL element can be applied.

The exposure apparatuses and the exposure method according to the invention has an advantage that a preferable image without "stripe-shaped unevenness" can be obtained when a photosensitive material is exposed with a plurality of exposure heads.

What is claimed is:

1. An exposure apparatus comprising:
 a first exposure head in which a plurality of light emitting sections which emit light with first intensity are arranged in a main scanning direction and in a sub scanning direction;
 a second exposure head in which a plurality of light emitting sections which emit light with second intensity are arranged in the main scanning direction and in the sub scanning direction in such a way that an exposure area including an overlapped exposure area overlapping an exposure area of the first exposure head is exposed by the second exposure head; and a driving control unit by which each of the light emitting sections of the first exposure head and the second exposure head is lit at a predetermined timing in such a way that a difference in the maximum exposure amount between pixels adjoining each other in the overlapped exposure area in the main scanning direction is smaller than a difference in the maximum exposure amount between each pixel in the exposure area of the first exposure head and each pixel in the exposure area of the second exposure head.

2. The exposure apparatus according to claim 1, wherein the maximum exposure amount of each pixel in the overlapped exposure area monotonously increase or decrease in the main scanning direction.

3. The exposure apparatus according to claim 2, wherein the maximum exposure amount of each pixel in the overlapped exposure area monotonously increase or decrease in the main scanning direction by changing a ratio between the number of light emitting sections which are lit with the first intensity and that of light emitting sections which are lit with the second intensity in a plurality of light emitting sections corresponding to the overlapped exposure area.

4. The exposure apparatus according to claim 1, wherein a common electrode is provided in such a way that a plurality of light emitting sections which are arranged in a different direction from the sub scanning direction are driven.

5. The exposure apparatus according to claim 1, wherein the light emitting elements are organic electroluminescent elements.

6. The exposure apparatus according to claim 1, wherein the maximum exposure amount is determined per pixel as a cumulative exposure amount of the first and second exposure head at each pixel.

7. An exposure apparatus comprising:
a first exposure head in which a plurality of light emitting sections which emit light with first intensity are arranged in a main scanning direction and in a sub scanning direction; and
a second exposure head in which a plurality of light emitting sections which emit light with second intensity are arranged in the main scanning direction and in the sub scanning direction in such a way that an exposure area including an overlapped exposure area overlapping an exposure area of the first exposure head is exposed by the second exposure head,
wherein the light emitting sections which emit light with the first intensity and the light emitting sections which emit light with the second intensity are provided in a predetermined ratio corresponding to the overlapped exposure area in such a way that a difference in the maximum exposure amount between pixels adjoining each other in the main scanning direction is smaller than a difference in the maximum exposure amount between each pixel in the exposure area of the first exposure head and each pixel in the exposure area of the second exposure head.

8. The exposure apparatus according to claim 7, wherein the maximum exposure amount of each pixel in the overlapped exposure area monotonously increase or decrease in the main scanning direction.

9. The exposure apparatus according to claim 7, wherein a common electrode is provided in such a way that a plurality of light emitting sections which are arranged in a different direction from the sub scanning direction are driven.

10. An exposure apparatus comprising:
a first exposure head in which a plurality of light emitting sections are arranged in a main scanning direction and in a sub scanning direction;
a second exposure head in which a plurality of light emitting sections are arranged in the main scanning direction and in the sub scanning direction in such a way that an exposure area including an overlapped exposure area overlapping an exposure area of the first exposure head is exposed by the second exposure head, and
a driving control unit by which each of the light emitting sections of the first exposure head and the second exposure head is lit with predetermined light emitting intensity and at a predetermined timing in such a way that a difference in the maximum exposure amount between pixels adjoining each other in the overlapped exposure area in the main scanning direction is smaller than a difference in the maximum exposure amount between each pixel in the exposure area of the first exposure head and each pixel in the exposure area of the second exposure head.

11. The exposure apparatus according to claim 10, wherein the maximum exposure amount of each pixel in the overlapped exposure area monotonously increase or decrease in the main scanning direction.

12. The exposure apparatus according to claim 11, wherein the maximum exposure amount of each pixel in the overlapped exposure area monotonously increase or decrease in the main scanning direction by changing a ratio of the light emitting intensity of the light emitting sections between the first exposure head and the second exposure head in a plurality of the light emitting sections corresponding to the overlapped exposure area.

13. The exposure apparatus according to claim 10, wherein a common electrode is provided in such a way that a plurality of light emitting sections which are arranged in a different direction from the sub scanning direction are driven.

14. An exposure apparatus comprising:
a first exposure head in which a plurality of light emitting sections which emit light with first intensity are arranged in a main scanning direction and in a sub scanning direction;
a second exposure head in which a plurality of light emitting sections which emit light with second intensity are arranged in the main scanning direction and in the sub scanning direction in such a way that an exposure area including an overlapped exposure area overlapping an exposure area of the first exposure head is exposed by the second exposure head, wherein
in light emitting sections in the first exposure head, which are disposed correspondingly to the overlapped exposure area, number of the light emitting sections which are used for exposure gradually decreases towards the downstream side in the main scanning direction and towards the downstream side of the sub scanning direction, and in light emitting sections in the second exposure head, which are disposed correspondingly to the overlapped exposure area, number of the light emitting sections which are used for exposure gradually increases towards the downstream side in the main scanning direction and towards the downstream side of the sub scanning direction.

15. An exposure apparatus comprising:

a first exposure head in which a plurality of light emitting sections which emit light with first intensity are arranged in a main scanning direction and in a sub scanning direction;

a second exposure head in which a plurality of light emitting sections which emit light with second intensity are arranged in the main scanning direction and in the sub scanning direction in such a way that an exposure area including an overlapped exposure area overlapping an exposure area of the first exposure head is exposed by the second exposure head, wherein in light emitting sections in the first exposure head, which are disposed correspondingly to the overlapped exposure area, light emitting intensity of the light emitting sections which are used for exposure gradually decreases towards the downstream side in the main scanning direction and towards the downstream side of the sub scanning direction, and in light emitting sections in the second exposure head, which are disposed correspondingly to the overlapped exposure area, light emitting intensity of the light emitting sections which are used for exposure gradually increases towards the downstream side in the main scanning direction and towards the downstream side of the sub scanning direction.

16. An exposure method for exposing a photosensitive material, using a first exposure head and a second exposure head, the second exposure head in which a plurality of light emitting sections are arranged in a main scanning direction and in a sub scanning direction being arranged in such a way that an exposure area including an overlapped exposure area overlapping an exposure area of the first exposure head in which a plurality of light emitting sections are arranged in the main scanning direction and in the sub scanning direction is exposed by the second exposure head, exposing the photosensitive material such that a difference in the maximum exposure amount between pixels adjoining each other in the overlapped exposure area in the main scanning direction is smaller than a difference in the maximum exposure amount between each pixel in the exposure area of the first exposure head except for the overlapped exposure area and each pixel in the exposure area of the second exposure head except for the overlapped exposure area.

* * * * *